United States Patent [19]
Miyawaki et al.

[11] Patent Number: 5,757,054
[45] Date of Patent: May 26, 1998

[54] DISPLAY UNIT

[75] Inventors: Mamoru Miyawaki, Isehara; Shunsuke Inoue, Yokohama, both of Japan

[73] Assignee: Canon Kabushiki Kaisha, Tokyo, Japan

[21] Appl. No.: 714,439

[22] Filed: Sep. 16, 1996

[30] Foreign Application Priority Data

Sep. 14, 1995 [JP] Japan .................. 7-236858
Sep. 12, 1996 [JP] Japan .................. 8-241938

[51] Int. Cl.⁶ .................. H01L 29/04; H01L 31/036
[52] U.S. Cl. .................. 257/390; 257/72; 257/347; 349/42; 349/54
[58] Field of Search .................. 257/59, 72, 347, 257/349, 390, 394; 349/42, 54

[56] References Cited

U.S. PATENT DOCUMENTS

| | | | |
|---|---|---|---|
| 5,317,433 | 5/1994 | Miyawaki et al. | 359/59 |
| 5,486,708 | 1/1996 | Takahashi et al. | 257/59 |
| 5,513,028 | 4/1996 | Sono et al. | 359/87 |
| 5,530,266 | 6/1996 | Yonehara et al. | 257/72 |
| 5,666,180 | 9/1997 | Ishizaki et al. | 351/58 |

Primary Examiner—Sara W. Crane
Attorney, Agent, or Firm—Fitzpatrick, Cella, Harper & Scinto

[57] ABSTRACT

The present invention solves problems as follows: a problem that, since light for displaying enters into a semiconductor substrate, carrier induced by light occurs in the semiconductor substrate, potential of the substrate fluctuates, and hence display characteristics become worse; a problem that, in the semiconductor substrate, voltages are applied to the peripheral driving circuits so as to operate the peripheral driving circuits formed in a single-crystal area, which makes display characteristics worse by the voltages being conducted to the display area through the substrate; and a problem that, in case potentials of adjacent pixels greatly differ, the difference locally changes. For this purpose, in a display unit including an active matrix substrate having an image display portion being provided with a plurality of switches and a driving circuit for supplying driving signals to the switches around the image display portion, an opposing substrate opposing the active matrix substrate and having a transparent electrode, and a liquid crystal material between both of the active matrix substrate and the opposing substrate, heavily doped impurity regions having impurity density heavier than that of the semiconductor substrate are formed in the image display portion, and the heavily doped impurity regions are connected to a fixed potential around the image display portion.

26 Claims, 7 Drawing Sheets

DISPLAY UNIT

BACKGROUND OF THE INVENTION

1. Field of the Invention

The present invention relates to an apparatus for displaying images and characters, and more particularly, a display unit using an active matrix liquid crystal panel.

2. Related Background Art

Recently, since the multimedia age comes, apparatuses for communication with image information have become more and more important. Among them, liquid crystal display units get much attention due to their thinness and small power consumption, and hence, the industry relating to them grows to a key industry in parallel with the semiconductor industry. Presently, liquid crystal display units are mainly used for note-type personal computers of 10-inches size. In future, they will be used for workstations, home TV sets as well as personal computers, and the liquid crystal display units having larger screen size will be used. However, for increasing the screen size, expensive apparatuses are needed, as well as strict requirements for electrical characteristics. Therefore, as their screen size becomes large, manufacturing cost sharply increases in proportion to square to cube of the screen size.

Then, a projection method gets attention, the method that a small liquid crystal display panel is made, and images optically enlarged are displayed. Because, similarly to the scaling law that, in company with fine patterning of semiconductors, performance and cost become better, it is possible to improve characteristics through miniaturization and also to decrease cost. Owing to these points, if the liquid crystal display panel is a TFT type, a TFT is requested that is small, and has sufficient driving power. Therefore, a TFT is moving from one using amorphous silicon to one using polysilicon. A video signal in the level of resolution used in the NTSC standard applied to usual TV broadcasting does not require high-speed processing. Therefore, it is possible to form not only TFT but also peripheral driving circuits such as shift registers or decoders with polysilicon. And hence, it is possible to build a liquid crystal display unit having one-piece structure, in which a display area and the peripheral driving circuits are included. However, since even polysilicon is inferior to single-crystal silicon, the shift register should be divided into a plurality of locations so as to realize the display of a high-definition TV having the level of resolution higher than that in the NTSC standard, and XGA and SXGA classes specified in the resolution standard for computers. In this case, it is desired to realize countermeasures to solve the problem that noise being called as ghosts occurs in display areas corresponding to divided lines.

Then, display units using single-crystal substrates also get much attention, the units which have driving power ultimately higher than that of the on-piece structured display units using polysilicon. In this case, it is not necessary to divide a register and drive divided registers as described above, because transistors of the peripheral driving circuits have sufficient driving power. Owing to this, problems such as the noise and the like can be solved.

However, liquid crystal display units using single-crystal silicon substrates even have problems as follows:

(1) Since light for displaying enters into a semiconductor substrate, carrier induced by light occurs in the semiconductor substrate, potential of the substrate fluctuates, and hence display characteristics become worse.

(2) In the semiconductor substrate, voltages are applied to the peripheral driving circuits so as to operate the peripheral driving circuits formed in a single-crystal area, which makes display characteristics worse by the voltages being conducted to the display area through the substrate.

(3) In case potentials of adjacent pixels greatly differ, the difference locally changes the potential of the semiconductor substrate, and changes display potentials of above-described adjacent pixels to make display characteristics worse.

SUMMARY OF THE INVENTION

Then, the purpose of the present invention is to solve above-described problems, and hence, it is to provide display units having high resolution, high brightness, high contrast, compact size, low cost, and wide angles of visual fields.

Then, present inventor's serious endeavor results in the following invention. Thus, a display unit according to the present invention is characterized in that, in a display unit comprising: an active matrix substrate having on a semiconductor substrate an image display portion where a plurality of switches are located, and a driving circuit portion supplying driving signals to the switches, around the image display portion; an opposing substrate opposing the active matrix substrate and having a transparent electrode; and a liquid crystal material being put between the active matrix substrate and the opposing substrate, the image display portion includes a heavily doped impurity region whose impurity density is larger than that of the semiconductor substrate and the heavily doped impurity region is connected to a fixed potential around the image display portion. Here, it is desirable to be provided with a plurality of data lines and a plurality of scanning lines in the image display portion, and a switch, capacitance means, and a pixel reflection electrode at each of their intersections. In addition, it is desirable that the switch is a thin-film transistor. It is recommended that the semiconductor substrate under the thin-film transistor is in the minimum potential in the display unit. It is recommended that an image display portion has a region whose density is between the impurity densities of the semiconductor substrate and heavily doped impurity region, and which has an electrically conductive type opposing that of the semiconductor substrate. The switch can be also a transmission gate. It is desirable for the transmission gate to be composed of single-crystal MOSFETs. It is desirable that a p-type well region is located below an n-channel MOSFET of the transmission gate and a p-type of the heavily doped impurity region is at a part of the p-type well region. It is desirable that an n-type semiconductor substrate is located below a p-channel MOSFET of the transmission gate and an n-type of the heavily doped impurity region is at a part of the n-type semiconductor substrate. It is desirable that the p-type of heavily doped impurity region and n-type of heavily doped impurity region are isolated by a thick oxide film. It is desirable to be provided with the heavily doped impurity region between thick oxide films. It is also recommended that a thin oxide film is between thick oxide films, a semiconductor region extending from a switch is on the oxide films, and, at an end of the extending semiconductor region, a heavily doped impurity region is located through the thin oxide film. The fixed potential is preferably a power supply potential.

It may be preferred that an area having an electric conductive type opposing the semiconductor substrate and an area having an electric conductive type identical to the semiconductor substrate, both of the areas having an impurity density which is in the midst between the impurity densities of the semiconductor substrate and the heavily doped impurity region, are further formed in an image display portion.

It may also be preferred that the area having an electric conductive type opposing the semiconductor substrate is provided in plurality and different electric potentials are applied to the plurality of the areas from each other.

It may also be preferred that the plurality of the areas are provided in the image display portion and around the image display portion.

It may also be preferred that an n-type well region is formed below a p-channel MOSFET of the transmission gate and an n-type of the heavily doped impurity region is located at a part of the n-type well region.

It may also be preferred that a p-type semiconductor substrate is located below an n-channel MOSFET of the transmission gate and a p-type of the heavily doped impurity region is located at a part of the p-type semiconductor substrate.

It may also be preferred that a p-type region having an impurity density which is in the midst between the impurity densities of the p-type semiconductor substrate and the p-type of heavily doped impurity region is further formed around the p-type of heavily doped impurity region.

According to the present invention, the following problems can be solved:

(1) a problem that, since light for displaying enters into a semiconductor substrate, carrier induced by light occurs in the semiconductor substrate, potential of the substrate fluctuates, and hence display characteristics become worse, (2) a problem that, in the semiconductor substrate, voltages are applied to the peripheral driving circuits so as to operate the peripheral driving circuits formed in a single-crystal area, which makes display characteristics worse by the voltages being conducted to the display area through the substrate, and (3) a problem that, in case potentials of adjacent pixels greatly differ, the difference locally changes the potential of the semiconductor substrate, and changes display potentials of above-described adjacent pixels to make display characteristics worse. Therefore, the present invention can provide display units having high resolution, high brightness, high contrast, compact size, and low cost.

DETAILED DESCRIPTION OF THE PREFERRED EMBODIMENTS

Hereafter, embodiments according to the present invention will be described by exemplifying five liquid crystal panels. However, the present invention is not limited to each of embodiments. It is apparent that combination of techniques in embodiments increases its effects. In addition, structures of liquid crystal panels are described as panels using semiconductor substrates. However, each of the substrates is not always limited to the semiconductor substrate, but it is possible to form a below-described structure on a usual transparent substrate. Furthermore, below-described liquid crystal panels are only TFT-types, but two-terminal types such as diode-types can be used. Still more, each of the liquid crystal panels described below is effective as a display unit for a home TV set, projector, head-mount display unit, 3D video game machine, lap top computer, electronic notebook, TV conference system, car navigation system, and panels in an airplane.

Embodiment 1

Figure 1A:
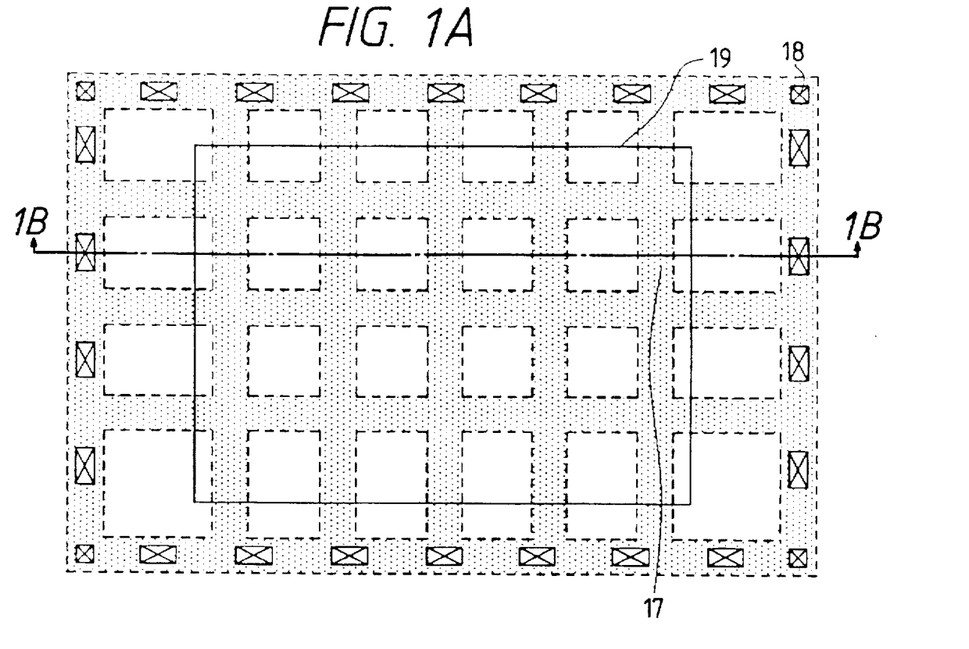
FIGS. 1A and 1B are a top view and a cross-sectional view showing a liquid crystal panel in a first embodiment according to the present invention.
Figure 1B:
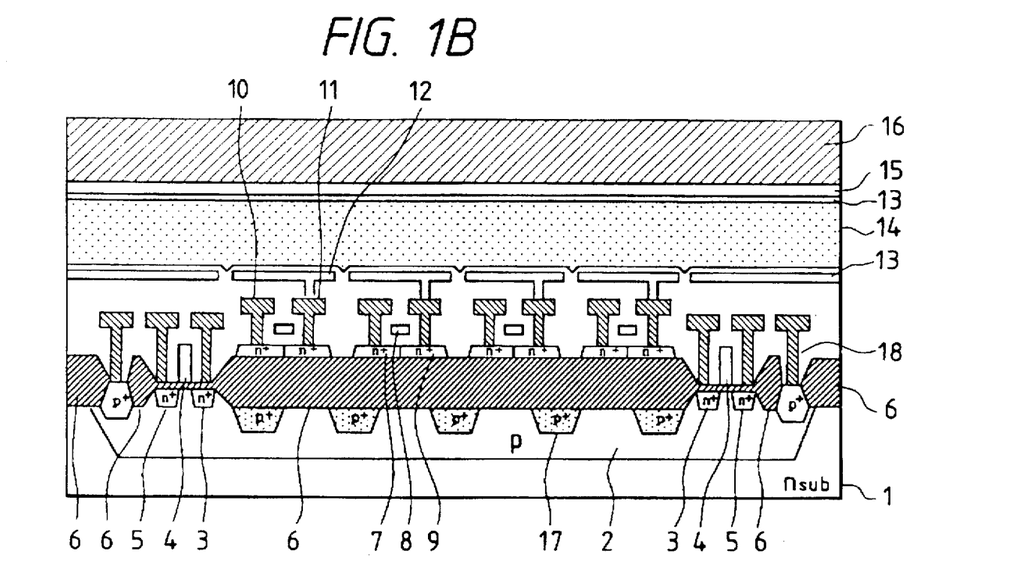

In a first embodiment according to the present invention, a lattice-like heavily doped impurity region is formed below a thin-film transistor in a display area through an insulation layer. FIGS. 1A and 1B are a top view and a cross-sectional view taken on line 1B—1B of FIG. 1A, which show an active matrix liquid crystal display panel using a first embodiment. In the views, reference numeral 1 represents a semiconductor substrate, 2 does a well region, and 3 to 5 do a source, drain, and gate of a MOSFET composing a peripheral driving circuit for the panel. And, 6 represents a field oxide film, 7 to 9 do a source, drain, and gate of a thin-film-transistor being a pixel switch in a display area, 10 does a source electrode connected to a data line, 11 does a drain electrode connected to a pixel reflection electrode, 12 does a pixel reflection electrode, 13 does a surface protective film, 14 does a liquid crystal material, 15 does a common transparent electrode, 16 does an opposing transparent electrode, 17 does a heavily doped impurity region, 18 does a connecting portion, and 19 does a display area.

Although the semiconductor substrate 1 in FIG. 1B is an n-type, a p-type can be used. If it is the n-type substrate, it is recommended that an impurity density of the substrate is $10^{14}$–$10^{17}$ cm$^{-3}$, and, $10^{14}$–$10^{15}$ cm$^{-3}$ is preferable for making a transistor having high-voltage resistant characteristics. The well region is made to be a conductive type opposing that of the semiconductor substrate. Owing to this, in FIG. 1B, the well region 2 is a p-type. It is desirable that the p-type well region 2 has impurity density higher than that in semiconductor substrate 1. Therefore, if the impurity density of the semiconductor substrate 1 is $10^{14}$–$10^{15}$ cm$^{-3}$, it is desirable that the impurity density of the well region 2 is $10^{16}$–$10^{17}$ cm$^{-3}$. The MOSFET 3, 4, and 5 in a peripheral driving circuit has an n-channel in FIG. 1B, and numerals 3 and 5 represent n$^+$ types of heavily doped impurity regions. Apparently, this MOSFET in the peripheral driving circuit can have a p-channel, and further, an npn bipolar transistor or pnp bipolar transistor can be used instead of the MOSFET. The field oxide film 6 is formed with the LOCOS method, and its thickness is desirable to be 3000–15000 Å. With this field oxide film 6, isolated regions of transistors in the peripheral driving circuits can be formed. Furthermore, in the structure shown in FIG. 1B, a front field oxide film is arranged in the display area, on which a thin-film transistor 7, 8, and 9 is formed as a switch for each pixel. In this thin-film transistor shown in FIG. 1B, its source 7 and drain 9 are n$^+$ types of heavily doped impurity regions, and hence, the transistor has an n-channel. Apparently, this thin-film transistor can be a p-channel transistor.

The source electrode 10 is connected to a data line to which a display signal is sent, and the drain electrode 11 is to the pixel reflection electrode 12. Al, AlSi, and AlSiCu lines are usually used as these electrodes 10 and 11. If a barrier metal layer composed of Ti and TiN is used under these electrodes 10 and 11, stable contact can be achieved. In addition, contact resistance can be also reduced. Since it is desirable to be a flat surface and high reflection material as a pixel reflection electrode, Cr, Au, and Ag can be used for pixel reflection electrode besides usual wiring materials such as Al, AlSi, and AlSiCu. Still more, it is recommended that, so as to improve flatness, surfaces of a base insulation layer and the pixel reflection electrode 12 are treated with the chemical mechanical polishing (CMP) method.

The surface protective film 13 protects the pixel reflection electrode 12 and is an orientation membrane. Polyimide is desirable to be a material for this film. Since the liquid crystal material 14 is a reflection type material, it is possible to use a macromolecular dispersion type liquid crystal for dispersion and non-dispersion mode, a guest-host type material controlling display with deflected light, a ferroelectric liquid crystal (FLC) material for reflection. The common transparent electrode 15 is on the opposing substrate 16, and images can be displayed by applying a voltage, corresponding to a signal of each pixel, between this common transparent electrode and the pixel reflection electrode.

The heavily doped impurity region 17 is a p-type and is formed under the field oxide film 6 below the display area 19. The heavily doped impurity region 17, as shown in FIG. 1A, is formed in a lattice figure extending to not only the Y direction but also the X direction inside the display area 19. Then, the area connects to the power supply potential through the connecting portion 18 in the peripheral portion of the display area.

Usually, the n-type semiconductor substrate 1 has the maximum potential of a power supply. Then, if there are no well region 2 and heavily doped impurity region 17, the n-type semiconductor substrate 1 is directly located under the field oxide film 6 formed under the TFT 7, 8, and 9. In this time, a bias potential at the maximum potential is applied to the TFT 7, 8, and 9, and hence, the threshold value of the TFT 7, 8, and 9 shifts to a lower value. Therefore, if the gate 8 of the TFT 7, 8, and 9 is at the minimum potential of the power supply, the TFT 7, 8, and 9 cannot be shut off, and hence, a video signal leaks, thereby contrast being lowered. Then, according to the first embodiment, by applying the minimum potential to the p-type well region 2, the threshold value of the TFT does not shift, and hence, high contrast display can be achieved. In addition, in the first embodiment, assuming that the impurity density of the p-type well region 2 is light, if a signal with large amplitude is applied to an adjacent pixel, the potential of the well region 2 is locally changed through the field oxide film 6. For this problem, the heavily doped impurity region 17 is formed below the display area 19. Owing to this, if a signal with large amplitude is applied to an adjacent pixel, it can be prevented that the potential of the well region is locally changed.

In addition, since the thickness of the semiconductor layer 7 and 9 of a TFT formed in the display area is thin, that is, 200–600 Å, and the thickness of the semiconductor substrate is thick, namely 500–700 μm, the possibility of absorption in the TFT is small when illumination light for displaying enters. When illumination light for displaying enters, carrier induced by light occurs in the semiconductor substrate 1, and hence, generated holes rapidly flow to a $p^+$ type of heavily doped impurity region and electrons do to an n-type substrate. Therefore, the problem of residual carrier does not also occur. Even if the carrier resides, the TFT is formed on the field oxide film 6, which is a second countermeasure.

Embodiment 2

In a second embodiment, a switch for each pixel is composed of a transmission gate comprising single-crystal n-channel and p-channel MOSFETs. Owing to this, its structure is that only the lower portion of the n-channel MOSFET is buried in a p-type well region, and the p-channel MOSFET is buried in the n-type substrate.

Figure 2A:
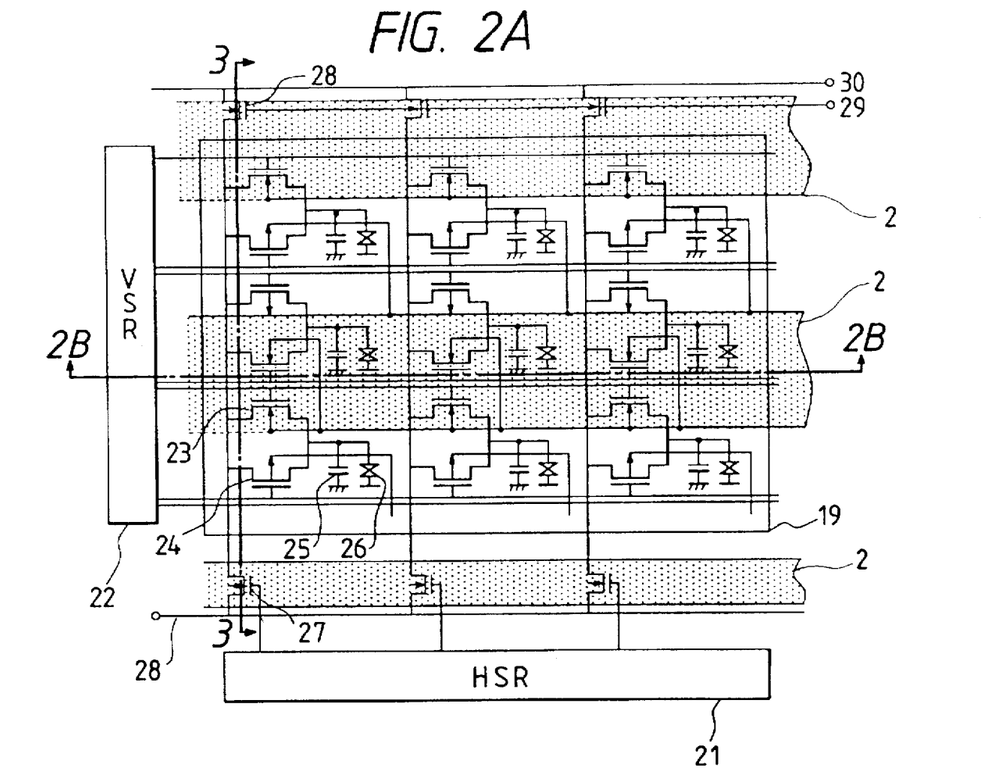
FIGS. 2A to 2B are a top view and a cross-sectional view showing a liquid crystal panel in a second embodiment according to the present invention.
Figure 2B:
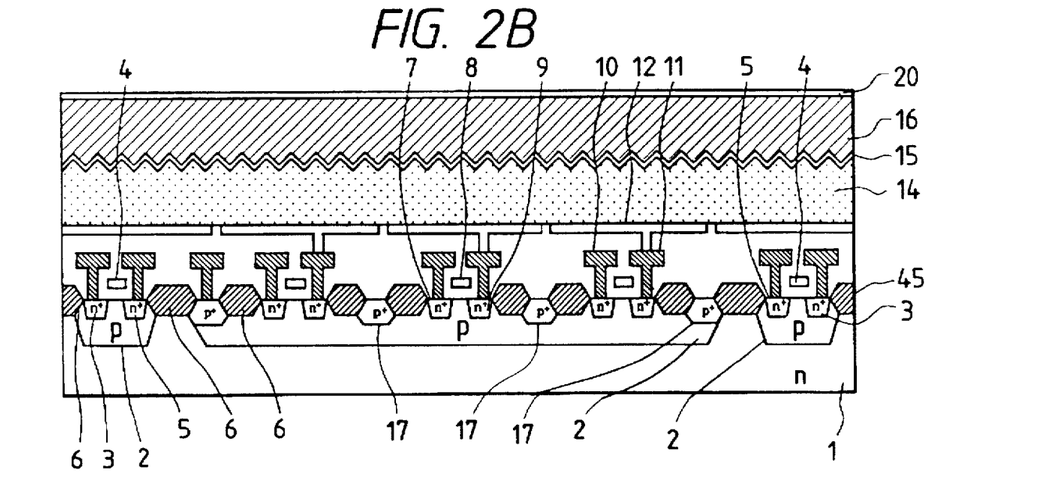
Figure 3:
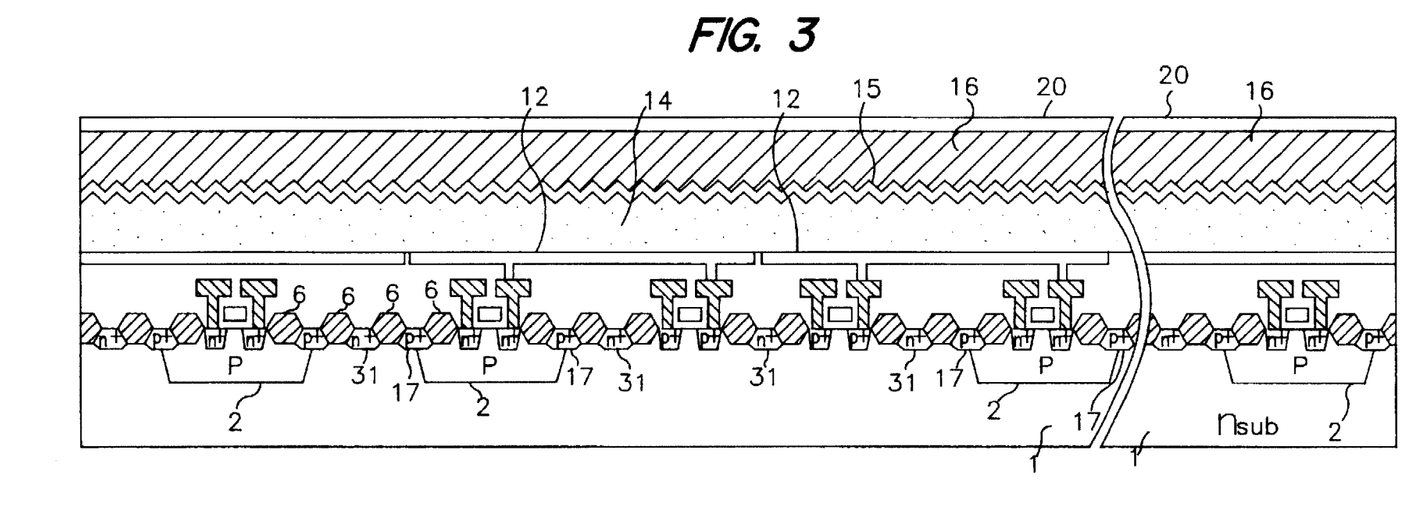
FIG. 3 is a cross-sectional view of the liquid crystal panel in the second embodiment according to the present invention.

FIGS. 2A and 2B are a top view and a cross-sectional view taken on line 2B—2B of FIG. 2A, which show a reflection-type active matrix liquid crystal display panel in a second embodiment. FIG. 3 is a cross-sectional view taken on line 3—3 of FIG. 2A. In drawings, reference numeral 20 represents a anti-reflection film, 21 does a horizontal shift register, 22 does a vertical shift register, 23 does an n-channel MOSFET, and 24 does a p-channel MOSFET. Furthermore, numeral 25 does a holding capacitance, 26 does a potential of a common transparent electrode 15 through a liquid crystal material, 27 does a signal transfer switch, 28 does a display signal input terminal, 29 does a reset pulse input terminal, 30 does a reset power supply terminal, and 31 does a video signal input terminal. Since the same numerals in FIG. 1A as those in FIG. 1B represent the same parts, description of these numerals will be omitted. The holding capacitance 25 is a capacitance for holding a signal between the pixel reflection electrode 12 and common transparent electrode 15. The substrate potential is applied to the well region 2. In the second embodiment, construction of a transmission gate of each raw is changed every raw. Thus, in the first raw, an upper transistor is an n-channel MOSFET 23, and a lower transistor is a p-channel MOSFET 24, and, on the other hand, in the second raw, the upper transistor is the p-channel MOSFET 24, and the lower transistor is the n-channel MOSFET 23.

A video signal (a video signal, pulse-modulated digital signal and the like) is inputted from the video signal input terminal 31, the signal transfer switch 27 is opened and closed in accordance with pulses from the horizontal shift register 21, and the video signal is outputted to each data line. The vertical shift register 22 applies a high pulse to the gate of the n-channel MOSFET 23 and a low pulse to the gate of the p-channel MOSFET in a selected raw.

Next, the cross-sectional view (FIG. 2B) taken on line 2B-2B (in FIG. 2A) will be described. This cross-sectional view is along the p-type well region. The MOSFET 7, 8, and 9 is an n-channel MOSFET of a transmission gate, under which a p-type of heavily doped impurity region 2 is formed. This heavily doped impurity region 2 is connected to a power supply at a peripheral portion of the display area though this is not shown. The common electrode substrate 16 has a wavy surface so as to prevent surface reflection by the common transparent electrode 15, and the common transparent electrode 15 is formed on the surface of the common electrode substrate 16. In addition, in the opposite side of the common transparent electrode substrate 16, the anti-reflection film 20 is formed.

Then, FIG. 3, the cross-sectional view taken on line 3—3 in FIG. 2A will be described. The $p^+$ type of heavily doped impurity region 17 is formed around the p-type well region 2. In order to obtain the substrate potential for the p-channel MOSFET, a n-type of heavily doped impurity region is formed through the field oxide film 6 in both sides of the source and drain of the p-channel MOSFET. The p-type of heavily doped impurity region 17 and n-type of heavily doped impurity region 31 are connected to the power supply at the peripheral portion of the display area.

According to the construction of the second embodiment, stable display characteristics can be realized without potential drift caused by carriers induced by light leakage, and without being affected by potential fluctuation by an adjacent pixel and the like. Furthermore, since a switch in the display area is composed of a transmission gate comprising single-crystal MOSFETs, the switch is not directly affected by Vth (a threshold value) of each MOSFET. Therefore, since contrast around a screen is not lowered, and influence such as temperature is small, high resolution display can be achieved.

Embodiment 3

Figure 4:
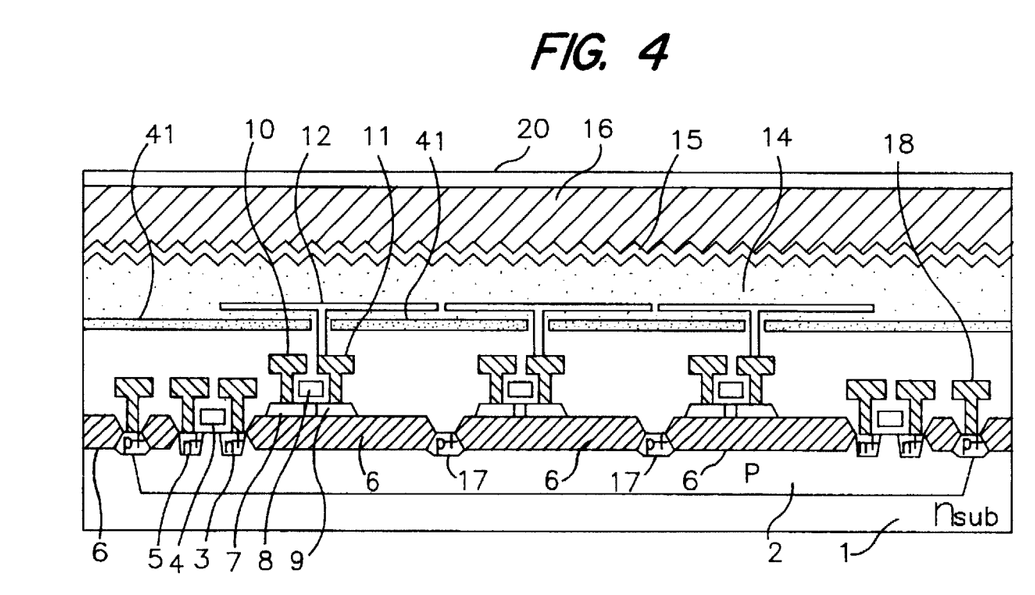
FIG. 4 is a cross-sectional view of a liquid crystal panel in a third embodiment according to the present invention.

In a third embodiment, an area (ACT area: active area usually forming a transistor) having no field oxide film is partially formed in the display area, and in the area, a well region or a heavily doped impurity region for fixing the substrate potential is formed. FIG. 4 is a cross-sectional view of a reflection type TFT active matrix liquid crystal display panel according to a third embodiment. Numeral 41 represents a shading metal layer for preventing illumination light from entering into pixels and circuit, and 42 does a insulation layer. Since the same numerals before FIG. 3 represent the same parts as those before FIG. 3, description of them will be omitted. The potentials of the semiconductor substrate 1 and well region 2 in the display area are fixed to the power supply potential of the peripheral portion of the display area by the p-type of heavily doped impurity region 17 formed between the field oxide films 6. This heavily doped impurity region 17 is formed with a p-channel MOSFET 3, 4, and 5 in the peripheral driving circuit, and $p^+$ areas such as a source and drain of a p-channel thin-film transistor 7, 8, and 9. Therefore, manufacturing processes are simple, and heavily doped impurity regions can be formed. Hence, panels can be constructed in lower cost, resistance of the heavily doped impurity regions becomes small, and hence, the substrate potential can be stabilized.

In addition, in the third embodiment, a holding capacitance for a video signal is formed with a shading metal layer 41, pixel reflection electrode 12, and insulation layer 42 between them. It is recommended that, in this time, the potential of the shading metal layer 41 is kept to be equal to that of the transparent electrode 15. By forming Ti, TiN and the like on or under the shading metal layer 41, it can be prevented that capacitance failure occurs due to hillock and the like. By using SiN, $Ta_2O_5$, and SiON besides usual $SiO_2$, a large capacitance can be formed in a small area. Owing to these, smaller pixel size can be realized, and high resolution and high contrast display can be realized.

Embodiment 4

Figure 5:
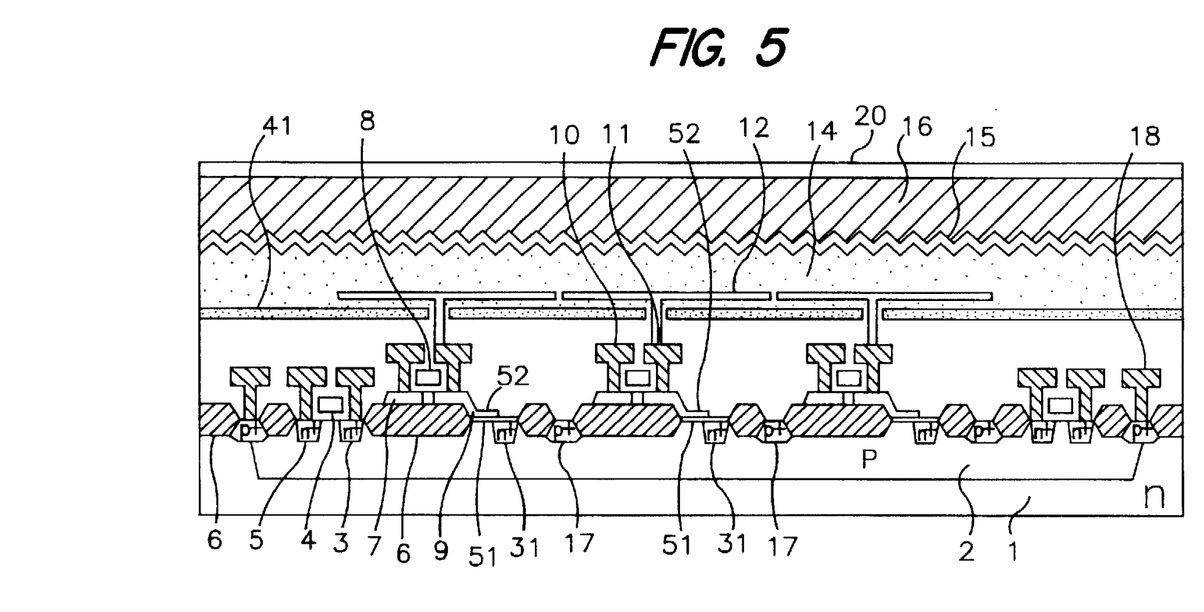
FIG. 5 is a cross-sectional view of a liquid crystal panel in a fourth embodiment according to the present invention.

In a fourth embodiment, an area having no field oxide film is partially formed in the display area, and in the area, wells or heavily doped impurity regions fixing the substrate potential are formed, and further, other heavily doped impurity regions are formed, the electric conductive types of which oppose those of the above heavily doped impurity regions. FIG. 5 is a cross-sectional view of a reflection type TFT active matrix liquid crystal display panel according to the fourth embodiment. Numeral 51 represents a thin portion of the field oxide film, and 52 does a portion extended from a drain 9 of a thin-film transistor 7, 8, and 9. Since the same numerals before FIG. 4 represent the same parts as those before FIG. 4, description of them will be omitted. Areas having no field oxide film are partially formed in the display area, and in the area, heavily doped impurity regions 17 are formed, and further, other heavily doped impurity regions 31 are formed, electric conductive types of which oppose those of the above heavily doped impurity regions. In addition, the portion 52 extended from a drain 9 of thin-film transistors 7, 8, and 9 is formed over the opposing electric conductive type of heavily doped impurity region 31 through the thin portion 51 of the field oxide film. The type of the portion 52 extended from a drain 9 is $n^+$ if the thin-film transistors 7, 8, and 9 has an n-channel, and $p^+$ if the thin-film transistor 7, 8, and 9 has a p-channel. It is also recommended that the opposing electric conductive type of heavily doped impurity region 31 is located at the end of the portion 52 extended from a drain 9. When the drain 9 of the thin-film transistor 7, 8, and 9 becomes at some voltage, an inversion layer occurs on the surface of the well region under the thin portion 51 of the field oxide film. Owing to this construction, the holding capacitance is further connected to the drain 9, and hence, high resolution and high contrast display can be realized.

Embodiment 5

As same as in a second embodiment, a switch for each pixel is composed of a transmission gate comprising single-crystal n-channel and p-channel MOSFETs. However, its structure is that only the lower portion of the n-channel MOSFET is buried in a p-type well region, and the p-channel MOSFET is buried in the n-type well region. In this embodiment, a p-type substrate is used.

Figure 7:
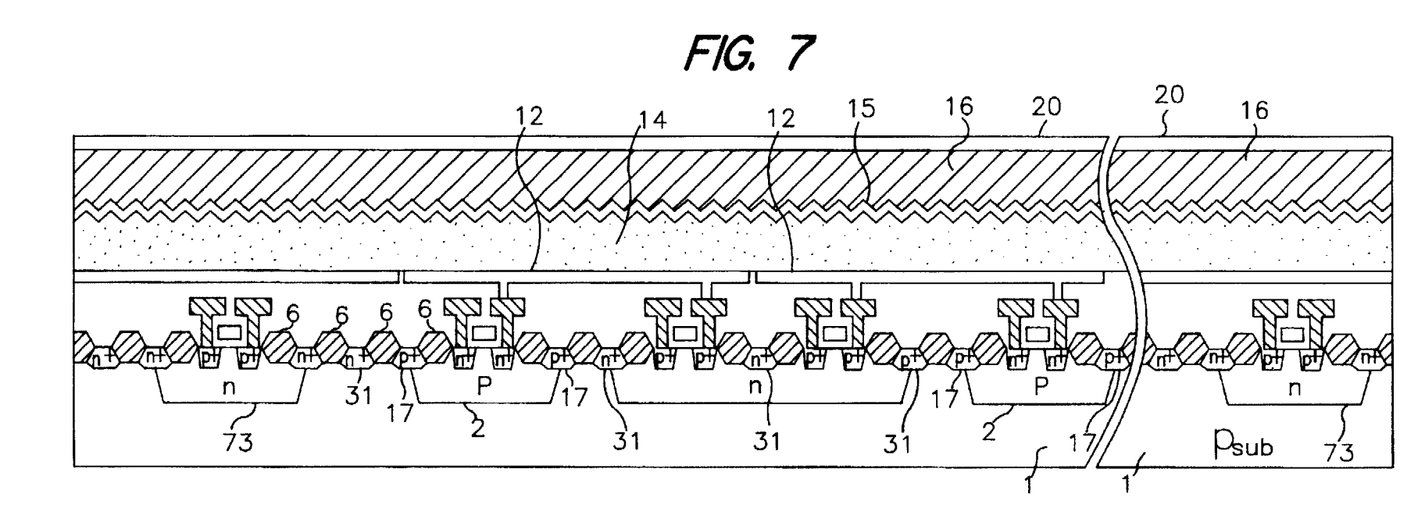
FIG. 7 is a cross-sectional view of a liquid crystal panel in a fifth embodiment according to the present invention.

FIG. 7 is a cross-sectional view of a liquid crystal panel in a fifth embodiment of the present invention. In the drawing, reference numeral 1 represents a p-type substrate, 72 does an n-type well region to which the source potential of the image display portion is applied, and 73 does an n-type well region to which the source potential of the peripheral driving circuit is applied.

Since a p-type substrate is used in the fifth embodiment, the substrate potential is set to the minimum potential of an electric source. In this instance, the standard potential of the panel is usually the earth potential and is therefore stable, which makes it fairly easy to respond to problems (short circuit, leakage, insulation, etc.) concerning zigs to fix the panel. Also, it is made possible to apply different potentials to separately provided n-type well regions in a p-type substrate. Due to this, such constitution as an image display portion adapted for 20 to 35V and a peripheral driving circuit adapted for 1 to 5V.

Further, a p-type well region 2 and an n-type well region 72 may be both provided in an image-display portion, i.e. so-called twin-well structure, to improve the threshold stability and withstand voltage of a transistor, thereby enlarging the degree of freedom.

Hence, as same as the construction of the second embodiment, stable display characteristics can be realized without potential drift caused by carriers induced by light leakage, and without being affected by potential fluctuation by an adjacent pixel and the like. Furthermore, since a switch in the display area is composed of a transmission gate comprising single-crystal MOSFETs, the switch is not directly affected by Vth (a threshold value) of each MOSFET. Therefore, since contrast around a screen is not lowered, and influence such as temperature is small, high resolution display can be achieved.

EXAMPLE 1

Figure 6:
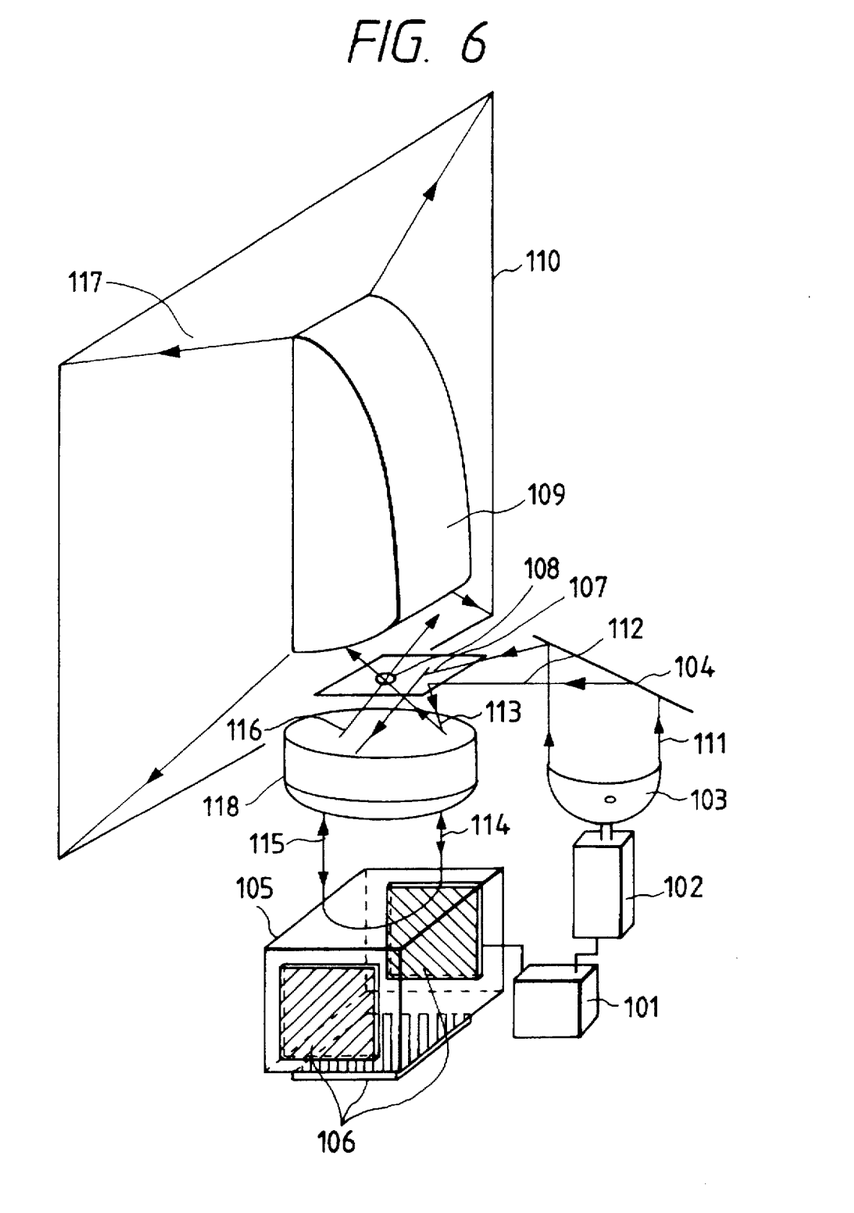
FIG. 6 is a drawing showing a projector in a first example according to the present invention.

A first example is an example that a projector is built using a reflection-type liquid crystal panel to which the above-described first embodiment is applied. First, a liquid crystal panel described in the first embodiment is built. Then, using the liquid crystal panel, a reflection-type of optical system is built. FIG. 6 is a perspective view of this optical system. In this view, numeral 101 represents a panel-driving and light-source-control board, 102 does an optical unit, 103 does a light source, 104 does an aspheric mirror, 105 does a color separation prism, 106 does the above-described liquid crystal panel, 107 does a micro mirror, 108 does an aperture, 109 does a free curvature prism optical system, 110 does a screen, and 118 does a telecentric system lens. Numerals 111 to 116 represent light.

The light beam 111 projected from the light source 103 is condensed by the aspherical mirror 104 and imaged on the micro mirror 107. Reflected light 113 from the micro mirror 107 is separated into red, green, and blue by the color separation prism 105, and enters into the liquid crystal panel 106 in a parallel ray. The liquid crystal panel 106 modulates the light, separated into red, green, and blue, according to a modulation signal. The modulated light 115 enters again to the lens 118, and its dark display light only passes through the aperture 108 and enters into the free curvature prism 109. Owing to using this free curvature prism optical system, it becomes possible to form images being thinner than and having smaller aberration than conventional ones on the screen 110. Owing to this, rear-type and front-type projection display units could be built in high resolution, high brightness, low cost, small sizes, and high contrast.

What is claimed is:

1. A display unit including an active matrix substrate having on a semiconductor substrate an image display portion provided with a plurality of switches and a driving circuit portion for supplying driving signals to said switches around said image display portion, an opposing substrate opposing said active matrix substrate and having a transparent electrode, and a liquid crystal material sandwiched between said active matrix substrate and said opposing substrate, wherein a heavily doped impurity region having an impurity density heavier than the impurity density of said semiconductor substrate is formed in said image display portion, and said heavily doped impurity region is connected to a fixed potential around said image display portion.

2. The display unit according to claim 1, wherein a plurality of data lines and a plurality of scanning lines are formed in said image display portion, and a switch, capacitance means, and pixel reflection electrode are formed at each of their intersections.

3. The display unit according to claim 1, wherein said switch is a thin-film transistor.

4. The display unit according to claim 3, wherein said semiconductor substrate just under said thin-film transistor is at the minimum potential in said display unit.

5. The display unit according to claim 1, wherein an area having an electric conductive type opposing said semiconductor substrate and having an impurity density which is in the midst between the impurity densities of said semiconductor substrate and said heavily doped impurity region is further formed in an image display portion.

6. The display unit according to claim 5, wherein said area having an electric conductive type opposing said semiconductor substrate is provided in plurality and different electric potentials are applied to the plurality of said areas from each other.

7. The display unit according to claim 6, wherein said plurality of said areas are provided in said image display portion and around said image display portion.

8. The display unit according to claim 1, wherein an area having an electric conductive type opposing said semiconductor substrate and an area having an electric conductive type identical to said semiconductor substrate, both of said areas having an impurity density which is in the midst between the impurity densities of said semiconductor substrate and said heavily doped impurity region, are further formed in an image display portion.

9. The display unit according to claim 8, wherein said area having an electric conductive type opposing said semiconductor substrate is provided in plurality and different electric potentials are applied to the plurality of said areas from each other.

10. The display unit according to claim 9, wherein said plurality of said areas are provided in said image display portion and around said image display portion.

11. The display unit according to claim 1, wherein said switch is a transmission gate.

12. The display unit according to claim 11, wherein said transmission gate is composed of single crystal MOSFETs.

13. The display unit according to claim 12, wherein a p-type well region is formed below an n-channel MOSFET of said transmission gate and a p-type of said heavily doped impurity region is located at a part of said p-type well region.

14. The display unit according to claim 12, wherein an n-type semiconductor substrate is located below a p-channel MOSFET of said transmission gate and an n-type of said heavily doped impurity region is located at a part of said n-type semiconductor substrate.

15. The display unit according to claim 13, wherein an n-type semiconductor substrate is located below a p-channel MOSFET of said transmission gate and an n-type of said heavily doped impurity region is located at a part of said n-type semiconductor substrate.

16. The display unit according to claim 12, wherein an n-type well region is formed below a p-channel MOSFET of said transmission gate and an n-type of said heavily doped impurity region is located at a part of said n-type well region.

17. The display unit according to claim 12, wherein a p-type semiconductor substrate is located below an n-channel MOSFET of said transmission gate and a p-type of said heavily doped impurity region is located at a part of said p-type semiconductor substrate.

18. The display unit according to claim 16, wherein a p-type semiconductor substrate is located below an n-channel MOSFET of said transmission gate and a p-type of said heavily doped impurity region is located at a part of said p-type semiconductor substrate.

19. The display unit according to claim 17, wherein a p-type region having an impurity density which is in the midst between the impurity densities of said p-type semiconductor substrate and said p-type of heavily doped impurity region is further formed around said p-type of heavily doped impurity region.

20. The display unit according to claim 18, wherein a p-type region having an impurity density which is in the midst between the impurity densities of said p-type semiconductor substrate and said p-type of heavily doped impurity region is further formed around said p-type of heavily doped impurity region.

21. The display unit according to claim 15, wherein said p-type of heavily doped impurity region and said n-type of heavily doped impurity region are isolated by a thick oxide film.

22. The display unit according to claim 18, wherein said p-type of heavily doped impurity region and said n-type of heavily doped impurity region are isolated by a thick oxide film.

23. The display unit according to claim 20, wherein said p-type of heavily doped impurity region and said n-type of heavily doped impurity region are isolated by a thick oxide film.

24. The display unit according to any of claims 1 to 23, wherein said heavily doped impurity region is located between thick oxide films.

25. The display unit according to any of claims 1 to 23, wherein a thin oxide film is located between thick oxide films, a semiconductor region extended from a switch is located on said oxide films, and a heavily doped impurity region is located at an edge of said extended semiconductor region through said thin oxide film.

26. The display unit according to any of claims 1 to 23, wherein said fixed potential is a power supply potential.

* * * * *